United States Patent
Cho et al.

(10) Patent No.: US 9,915,847 B2
(45) Date of Patent: Mar. 13, 2018

(54) DISPLAY DEVICE WITH PIXEL ARRANGEMNT FOR HIGH RESOLUTION

(71) Applicant: LG DISPLAY CO., LTD., Seoul (KR)

(72) Inventors: Seongjun Cho, Paju-si (KR); Euihyun Chung, Goyang-si (KR); Kangil Kim, Paju-si (KR); Wondoo Kim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/217,625

(22) Filed: Jul. 22, 2016

(65) Prior Publication Data

US 2017/0192328 A1     Jul. 6, 2017

(30) Foreign Application Priority Data

Dec. 31, 2015 (KR) .................. 10-2015-0191813

(51) Int. Cl.
| | |
|---|---|
| H01L 27/14 | (2006.01) |
| H01L 29/04 | (2006.01) |
| H01L 29/15 | (2006.01) |
| H01L 31/036 | (2006.01) |
| G02F 1/1362 | (2006.01) |
| G02F 1/1335 | (2006.01) |
| G02F 1/1368 | (2006.01) |
| H01L 27/12 | (2006.01) |
| H01L 29/45 | (2006.01) |
| H01L 29/786 | (2006.01) |
| G02F 1/1343 | (2006.01) |

(52) U.S. Cl.
CPC ...... *G02F 1/136286* (2013.01); *G02F 1/1368* (2013.01); *G02F 1/133514* (2013.01); *G02F 1/134336* (2013.01); *H01L 27/124* (2013.01); *H01L 27/127* (2013.01); *H01L 27/1225* (2013.01); *H01L 29/45* (2013.01); *H01L 29/78696* (2013.01); *G02F 2201/123* (2013.01); *G02F 2201/52* (2013.01)

(58) Field of Classification Search
CPC ................. G02F 1/133555; G02F 2201/52
See application file for complete search history.

(56) References Cited

U.S. PATENT DOCUMENTS

| | | | | |
|---|---|---|---|---|
| 6,707,441 | B1 * | 3/2004 | Hebiguchi | G09G 3/3648 345/92 |
| 8,605,126 | B2 * | 12/2013 | Kang | G09G 3/3614 345/55 |
| 9,024,850 | B2 * | 5/2015 | Lee | G02F 1/136286 345/104 |

(Continued)

*Primary Examiner* — Ismail Muse
(74) *Attorney, Agent, or Firm* — Birch, Stewart, Kolasch & Birch, LLP

(57) ABSTRACT

A display device is provided. The display device can include a first pixel portion comprising a first thin-film transistor provided at the intersection between a first gate line and a first data line, and a first pixel electrode connected to the first thin-film transistor, and a second pixel portion comprising a second thin-film transistor provided at the intersection between a second gate line and the first data line, and a second pixel electrode connected to the second thin-film transistor, wherein the first pixel portion and the second pixel portion are arranged parallel to the first data line, and directions extended the first pixel electrode and the second pixel electrode are extended in such a direction as to face each other.

19 Claims, 10 Drawing Sheets

(56) References Cited

U.S. PATENT DOCUMENTS

| | | | |
|---|---|---|---|
| 2006/0203172 A1* | 9/2006 | Baek | G02F 1/1368 |
| | | | 349/146 |
| 2007/0268433 A1* | 11/2007 | Moon | G02F 1/133555 |
| | | | 349/114 |
| 2007/0296883 A1* | 12/2007 | Kwon | G02F 1/136286 |
| | | | 349/43 |
| 2009/0268119 A1* | 10/2009 | Lee | G02F 1/136259 |
| | | | 349/54 |
| 2010/0220254 A1* | 9/2010 | Liu | H01L 33/08 |
| | | | 349/46 |
| 2012/0092321 A1* | 4/2012 | Lin | G02F 1/136213 |
| | | | 345/211 |
| 2012/0287382 A1* | 11/2012 | Qi | G02F 1/133512 |
| | | | 349/106 |
| 2013/0258264 A1* | 10/2013 | Peng | G02F 1/134309 |
| | | | 349/139 |
| 2013/0334507 A1* | 12/2013 | Shimoji | F21V 9/08 |
| | | | 257/40 |
| 2014/0159798 A1* | 6/2014 | Duan | G09G 3/3611 |
| | | | 327/434 |
| 2015/0153614 A1* | 6/2015 | Qi | G02F 1/133516 |
| | | | 359/890 |
| 2015/0372016 A1* | 12/2015 | Cheng | H01L 27/124 |
| | | | 257/72 |
| 2016/0253010 A1* | 9/2016 | Xu | G02F 1/13338 |
| | | | 349/12 |
| 2016/0276396 A1* | 9/2016 | Tayanaka | H01L 27/14623 |

\* cited by examiner

<RELATED ART>

DISPLAY DEVICE WITH PIXEL ARRANGEMNT FOR HIGH RESOLUTION

CROSS-REFERENCE TO RELATED APPLICATIONS

This application claims the priority benefit of Korean Patent Application No. 10-2015-0191813 filed on Dec. 31, 2015, which is hereby incorporated herein by reference for all purposes as if fully set forth herein.

BACKGROUND OF THE INVENTION

Field of the Invention

The present invention relates to a display device.

Discussion of the Related Art

In general, liquid crystal displays operate using the optical anisotropy and polarization properties of a liquid crystal. The molecules of the liquid crystal have an orientational order because of the long and thin structure of the liquid crystal, and the orientation of the molecules can be controlled by artificially applying an electric field to the liquid crystal. As such, arbitrary control of the orientation of the molecules in the liquid crystal can change the molecular arrangement of the liquid crystal, and a ray of light is refracted in the direction of orientation of the liquid-crystal molecules because of optical anisotropy, thus representing picture information.

Currently, active-matrix liquid crystal displays (AM-LCD; hereinafter, abbreviated as liquid crystal displays), in which thin-film transistors and pixel electrodes connected to the thin-film transistors are arranged in a matrix, are drawing the most attention because of their high resolution and video rendering capability. This type of liquid crystal display comprises a color filter substrate with a common electrode, an array substrate with pixel electrodes, and a liquid crystal sandwiched between the two substrates. In such a liquid crystal display, the common electrode and the pixel electrodes drive pixels by a vertically applied electric field, offering high transmittance and high aperture ratio. However, driving the liquid crystal by a vertically applied electric field has a poor viewing angle. To overcome this shortcoming, in-plane switching liquid crystal displays for a greater viewing angle were suggested. The in-plane switching liquid crystal displays have a wider viewing angle because the pixels are driven using a horizontal electric field between the pixel electrodes and the common electrode.

Along with the recent increase in display resolution, pixels per inch (PPI) are also increasing, leading to the current trend toward to smaller pixel size and pitch.

FIG. 1 is a plan view showing pixels and color filters in a display device according to a related art. Referring to FIG. 1, a red color filter CR, a green color filter CG, and a blue color filter CB are arranged to correspond to a red subpixel R, a green subpixel G, and a blue subpixel B, respectively. The size and pitch of subpixels are getting smaller due to the higher resolution. The subpixels require a pitch of approximately 3 μm in order to allow the patterning of the color filters. Thus, if the pitch of the subpixels is decreased to less than approximately 2.2 μm due to the higher resolution, this makes it difficult to make the color filters. Also, the color filters require a width of approximately 10 μm in order to allow the patterning of the color filters. However, if the width of the subpixels is decreased due to the higher resolution and the width of the color filters is decreased to less than approximately 8.4 μm, this also makes it difficult to make the color filters. If the width of opening regions in the subpixels is decreased to less than 4.4 μm, the opening regions in the subpixels will are narrow due to the black matrix. Because the black matrix will have a linear width of only 4 μm.

With the reduction in the size and pitch of the subpixels due to the higher resolution, the size and width of the color filters to be provided on the color filter substrate of the display device need to be reduced, and the pitch of the black matrix needs to be reduced also. However, there are difficulties in forming a fine pattern because of the characteristics of the color filters and black matrix, making it difficult to cope with the higher resolution.

SUMMARY OF THE INVENTION

The present invention is directed to a display device that substantially obviates one or more of the problems due to limitations and disadvantages of the related art.

An object of the present invention is to provide a display device that can cope with high resolution by changing the arrangement of pixels and the arrangement of color filters.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, a display device can include a first pixel portion comprising a first thin-film transistor provided at the intersection between a first gate line and a first data line, and a first pixel electrode connected to the first thin-film transistor, and a second pixel portion comprising a second thin-film transistor provided at the intersection between a second gate line and the first data line, and a second pixel electrode connected to the second thin-film transistor, in which the first pixel portion and the second pixel portion are arranged parallel to the first data line, and the first pixel portion and the second pixel portion are arranged parallel to the first data line, and the first pixel electrode and the second pixel electrode extend in such a way so that their respective ends face each other.

The first and second pixel electrodes can extend in a direction away from the drain electrodes of the first and second thin-film transistors, respectively.

The display device further can include a third gate line parallel to the first gate line and intersecting the first pixel portion, and a fourth gate line parallel to the third gate line and intersecting the second pixel portion.

In one example, the first pixel electrode intersects the first gate line. The first and second thin film transistors each comprise an active layer.

The active layer of the first thin-film transistor can intersect the first and second gate lines, and the active layer of the second thin-film transistor can intersect the third and fourth gate lines.

In one or more embodiments, the display device further comprises a color filter that overlaps at least the first and second pixel portions. The color filter represents the same color. The color filter has a single pattern. The color filter overlaps an opening region of the first pixel portion and an opening region of the second pixel portion.

In one or more embodiments, the color filter overlaps non-opening regions of pixel portions adjacent to the opening region of the first pixel portion and non-opening regions of pixel portions adjacent to the opening region of the second pixel portion.

In one or more embodiments, an arrangement of the color filters is a honeycomb shape, each of the color filters has a hexagonal shape. The color filter comprises a middle portion and projections projecting upward and downward from the middle portion. Each of the middle portion and the projections are quadrangle-shaped.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
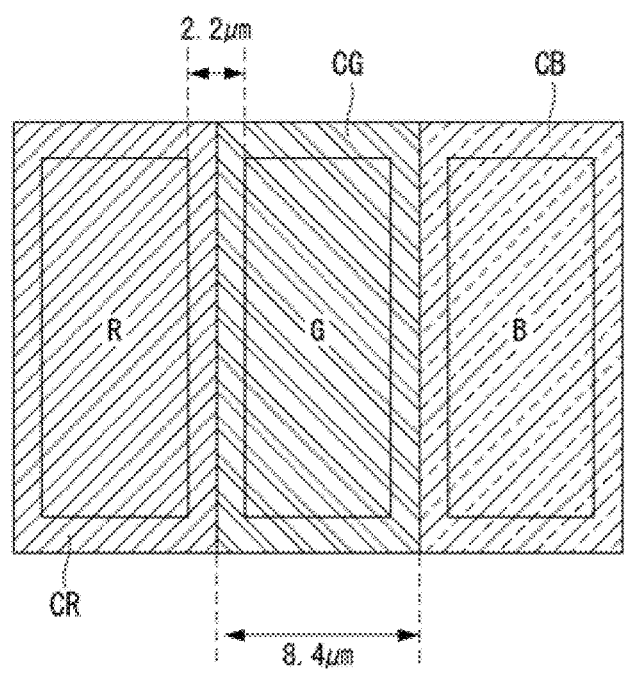
FIG. 1 is a plan view showing pixels and color filters in a display device according to a related art.

Hereinafter, exemplary embodiments of the present invention will be described in detail with reference to the accompanying drawings. The same reference numerals designate substantially the same elements throughout the specification. In the following description, detailed descriptions of well-known functions or configurations associated with the present invention will be omitted if they are deemed to unnecessarily obscure the subject matters of the present invention.

Hereinafter, an exemplary embodiment of the present invention will be described with reference to the accompanying drawings.

Figure 2:
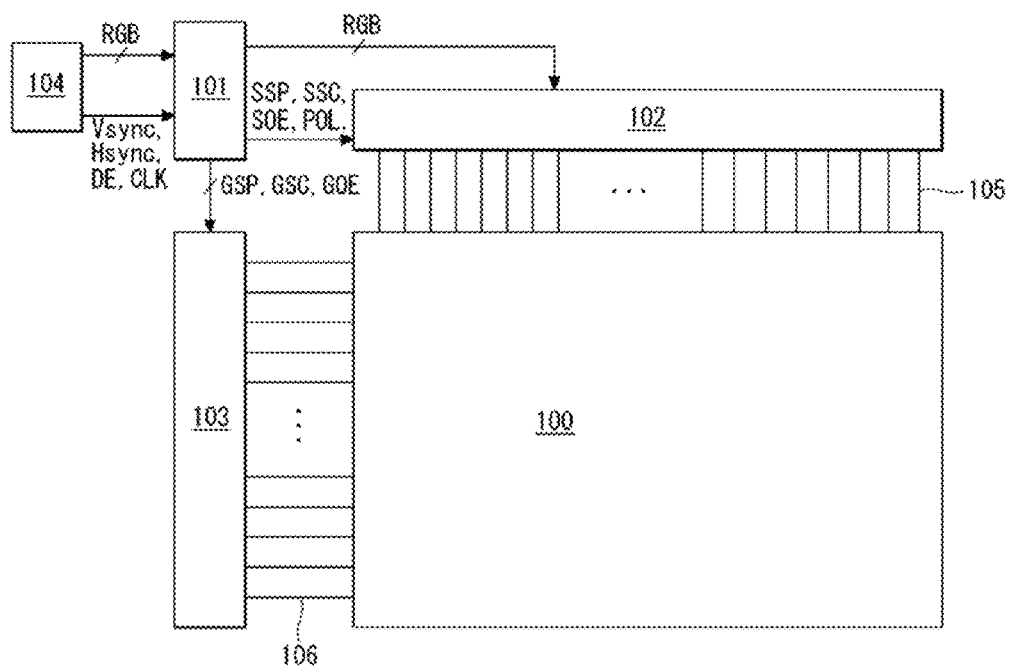
FIG. 2 is a block diagram showing a display device according to an exemplary embodiment of the present invention.

FIG. 2 is a block diagram showing a display device according to an exemplary embodiment of the present invention. All the components of the display device according to all embodiments of the present invention are operatively coupled and configured.

Referring to FIG. 2, a display device according to an exemplary embodiment of the present invention comprises a display panel 100, a data driver 102, a gate driver 103, and a timing controller 101. A backlight unit for giving off uniform light over the display panel 100 may be disposed under the display panel 100. The backlight unit may be implemented as a direct-type backlight unit or an edge-type backlight unit.

The display panel 100 comprises a thin-film transistor array substrate (or first substrate) and a color filter array substrate (or second substrate) that face each other with a liquid crystal layer between them. A pixel array for displaying video data is formed in the display panel 100. The pixel array comprises pixels that are arranged in a matrix by the intersection of data lines and gate lines. The pixels may comprise R pixels, G pixels, and B pixels. Neighboring pixels share the same data line. Liquid crystal cells of the pixels display an image of video data by adjusting the amount of light transmission by an electric field between a data voltage applied to pixel electrodes and a common voltage applied to a common electrode. In case of vertical electric field driving modes such as TN (Twisted Nematic) driving mode and VA (Vertical Alignment) driving mode, the common electrode is formed on the color filter array substrate. In case of horizontal electric field driving modes such as in-plane switching (IPS) driving mode and fringe field switching (FFS) driving mode, the common electrode, together with the pixel electrodes, is formed on the thin-film transistor array substrate.

The thin-film transistor array substrate comprises data lines, gate lines, thin-film transistors, pixel electrodes connected to the thin-film transistors on a one-to-one basis, and storage capacitors Cst connected to the pixel electrodes on a one-to-one basis. A black matrix and color filters are formed on the color filter array substrate of the display panel 100. In this exemplary embodiment, the common electrode is formed on the thin-film transistor array substrate. Polarizers are attached to the color filter array substrate and TFT array substrate of the display panel 100, respectively. Alignment layers for setting a pre-tilt angle of liquid crystals are formed to the color filter array substrate and TFT array substrate of the display panel 100, respectively.

The display panel 100 applicable in the present invention may be implemented in any liquid crystal mode, as well as the TN mode, VA mode, IPS mode, and FFS mode. The liquid crystal display of present invention may be implemented in any form including a transmissive liquid crystal display, a semi-transmissive liquid crystal display, and a reflective liquid crystal display. The transmissive liquid crystal display and the semi-transmissive liquid crystal display require a backlight unit. The backlight unit may be implemented as a direct-type backlight unit or an edge-type backlight unit.

The data driver 102 comprises a plurality of source drive ICs. Output channels of the source drive ICs are connected to the data lines in the pixel array on a one-to-one basis. Each source drive IC receives digital video data from the timing controller 101. In response to a source timing control signal from the timing controller 101, the source drive ICs convert digital video data to positive/negative data voltages and supply them to the data lines in the pixel array through the output channels. The source drive ICs supply data voltages of opposite polarities to neighboring data lines under the control of the timing controller 101, hold the polarities of the data voltages supplied to the data lines for one frame period, and then invert the polarities of the data voltages in the next frame period. That is, as is the case with column inversion method, the source drive ICs hold the polarities of the data voltages for one frame period, and invert the polarities of the data voltages every frame.

The gate driver 103 sequentially supplies a gate pulse to the gate lines in the pixel array in response to a gate timing control signal from the timing controller 101. The timing controller 101 supplies digital video data input from an external system board 104 to the source drive ICs in the data driver 102. The timing controller 101 generates a source timing control signal for controlling the operation timing of the data driver 102 and a gate timing control signal for controlling the operation timing of the gate driver 103.

Figure 3:
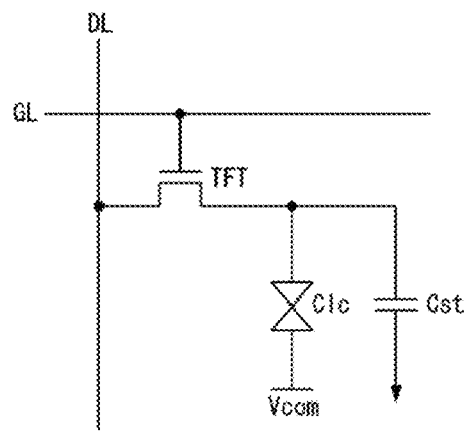
FIG. 3 is a circuit diagram showing a pixel of a display device according to an embodiment of the present invention.

Referring to FIG. 3, the display device of present invention converts digital video data to an analog data voltage based on a gamma reference voltage and supplies it to the data line DL, and at the same time, supplies a scan pulse to the gate line GL to charge the liquid crystal cell Clc with the data voltage. To this end, the gate electrode of the thin-film transistor is connected to the gate line GL, its source electrode is connected to the data line DL, and the drain electrode of the thin-film transistor is connected to the pixel electrode of the liquid crystal cell Clc and one electrode of the storage capacitor Cst. A common voltage Vcom is supplied to the common electrode of the liquid crystal cell Clc. The storage capacitor Cst serves to store the data voltage applied from the data line DL when the thin-film transistor turns on and to keep the voltage of the liquid crystal cell Clc constant. When a scan pulse is applied to the gate line GL, the TFT turns on to form a channel between the source and drain electrodes and supply the voltage across the data line DL to the pixel electrode of the liquid crystal cell Clc. At this point, the arrangement of liquid molecules in the liquid crystal cell Clc is changed by an electric field between the pixel electrode and the common electrode. Based on this principle, the display device of present invention is operated.

The schematic configuration of a display device according to an exemplary embodiment of the present invention has been described above. Given below is a detailed description of a pixel array structure for the display panel of the display device. In the description, reference numerals different from those in FIGS. 2 and 3 will be used.

Figure 4:
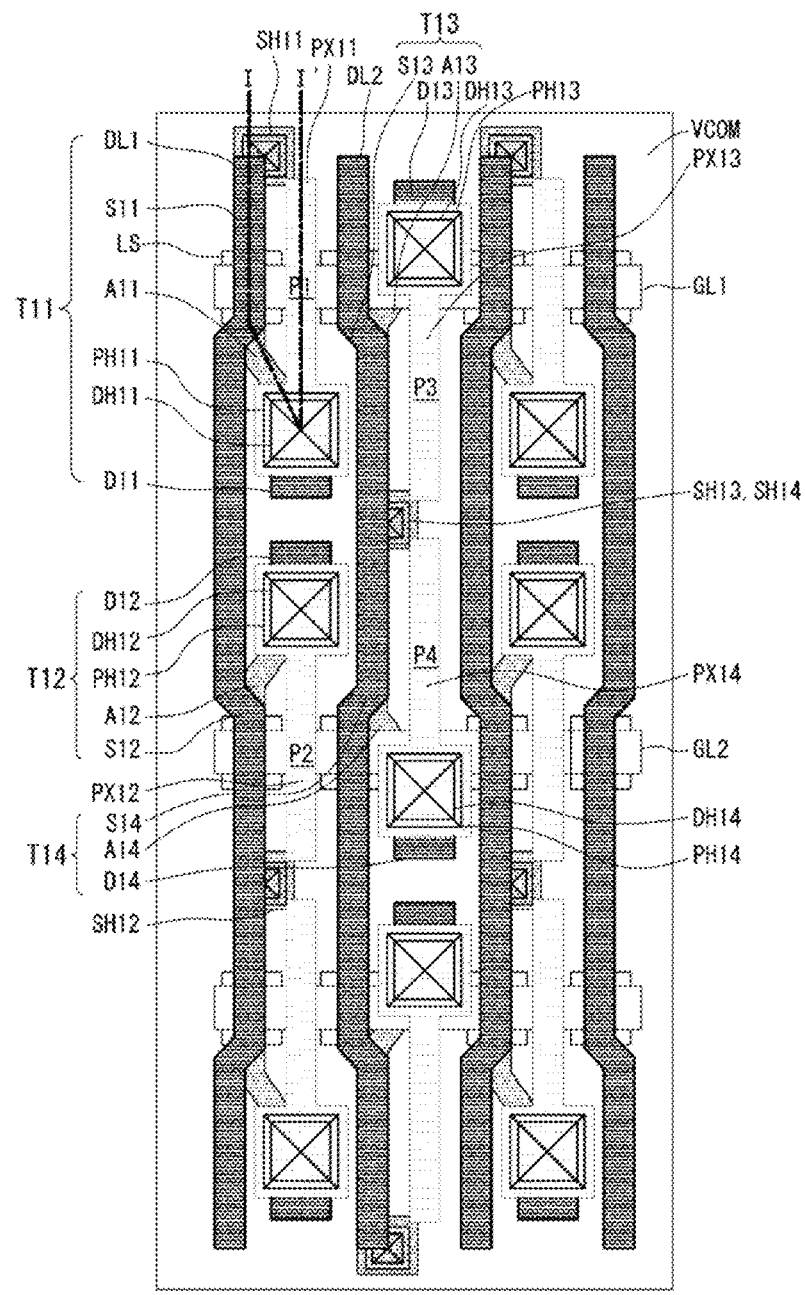
FIG. 4 is a plan view showing a thin-film transistor array substrate for a liquid crystal display according to a first exemplary embodiment of the present invention.
Figure 5:
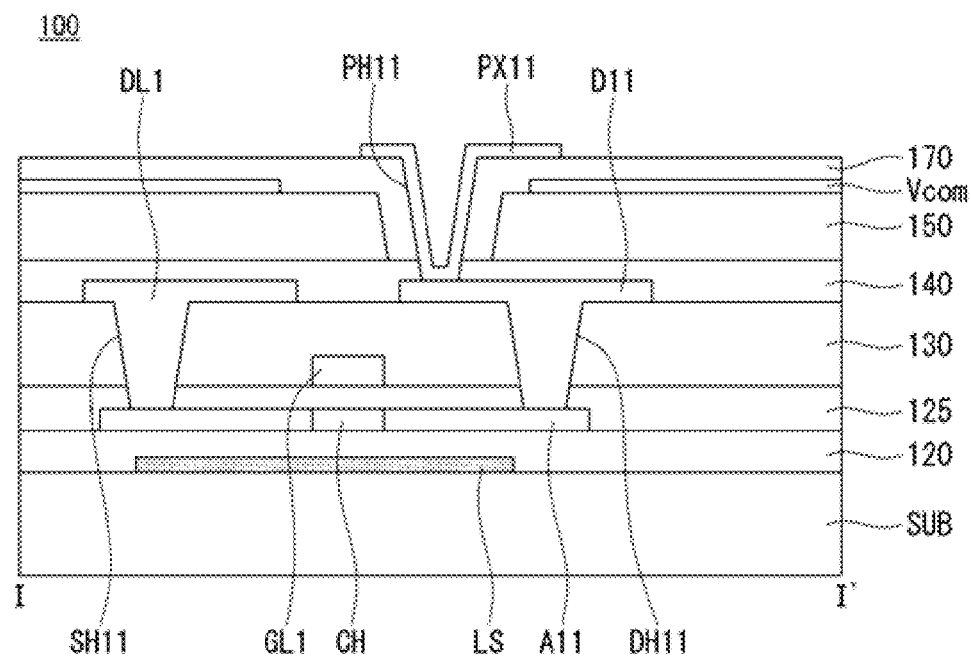
FIG. 5 is a cross-sectional view taken along line I-I' of FIG. 4.

FIG. 4 is a plan view showing a thin-film transistor array substrate for a liquid crystal display according to a first exemplary embodiment of the present invention. FIG. 5 is a cross-sectional view taken along line I-I' of FIG. 4.

Referring to FIG. 4, a thin-film transistor array substrate for a liquid crystal display according to the first exemplary embodiment of the present invention comprises a plurality of gate lines GL1, GL2, . . . extending horizontally on a substrate SUB and a plurality of data lines DL1, DL2, . . . extending vertically on the substrate SUB. A Pixel area is defined a rectangular area defined by the intersection of the gate lines GL, GL2, . . . and the data lines DL1, DL2, . . . .

The pixel area at the top of the left side of a certain data line DL2 is defined as a first pixel portion P1, a pixel area below the first pixel portion P1 is defined as a second pixel portion P2, a pixel area at the top of the right side of the data line DL2 is defined as a third pixel portion P3, and a pixel area below the third pixel portion P3 is defined as a fourth pixel portion P4.

The first pixel portion P1 of present invention is defined as a point where the first gate line GL1 and the first data line DL1 intersect. The first pixel portion P1 comprises a first thin-film transistor T11 provided at the intersection between the first gate line GL1 and the first data line DL1, and a first pixel electrode PX11 connected to the first thin-film transistor T11. The first thin-film transistor T11 of the first pixel portion P1 comprises a first active layer A11, the first gate line GL1 acting as a gate electrode, a first source electrode S11, and a first drain electrode D11. The first active layer A11 is in an I-shape as it overlaps the first data line DL1. Also, the first active layer A11 comprises one channel by intersecting the first gate line GL1. The first data line DL1 acting as the first source electrode S11 extends to come into contact with one end of the first active layer A11 via a first source contact hole SH11. Since the first data line DL1 acts as a source electrode, the first source contact hole SH11 overlaps the first data line DL1. The first drain electrode D11 comes into contact with the other end of the first active layer A11 via a first drain contact hole DH11. The first drain contact hole DH11 does not overlap the first gate line GL1 but is spaced apart from it.

The first pixel electrode PX11 has the shape of a line segment, and is arranged parallel to the first data line DL1. The higher the resolution, the smaller the number of line segments of the first pixel electrode PX11. Although, in the present invention, the first pixel electrode PX11 consists of a single line segment, it may consist of, for example, three to four line segments (or fingers) at a resolution of about 300 PPI or two or three line segments at a resolution of 400 to 500 PPI. The first pixel electrode PX11 may consist of one or two line segments at a super-high resolution of 600 PPI or higher. The first pixel electrode PX11 intersects the first gate line GL1.

The first pixel electrode PX11 is connected to the first drain electrode D11 of the first thin-film transistor T11 via a first via hole PH11. The first via hole PH11 overlaps the first drain contact hole DH11. The first pixel electrode PX11 and the common electrode Vcom face each other, forming an electric field. The common electrode Vcom may be formed to cover most of the area of the substrate SUB. In this case, the common electrode Vcom is in the form of a surface electrode that occupies most of the first pixel electrode PX11. As a result, the common electrode Vcom and the first pixel electrode PX11 overlap each other with a passivation layer between them, thereby forming a horizontal electric field caused by a fringe field.

Although this drawing illustrates a thin-film transistor with an I-shaped channel forming region, the present invention is not limited to this, but a thin-film transistor with a U-shaped channel forming region is also applicable. Moreover, although this drawing illustrates that the gate electrode of a thin-film transistor acts as a gate line, the present invention is not limited to this, but the gate electrode may be a projection from the gate line.

The second pixel portion P2 of present invention is defined by the intersection of the second gate line GL2 and the first data line DL1. The second pixel portion P2 comprises a second thin-film transistor T12 provided at the intersection between the second gate line GL2 and the first data line DL1, and a second pixel electrode PX12 connected to the second thin-film transistor T12. The second thin-film transistor T12 of the second pixel portion P2 comprises a second active layer A12, the second gate line GL2 acting as a gate electrode, the first data line DL1 acting as a second source electrode S12, and a second drain electrode D12. The second active layer A12 is in an I-shape as it overlaps the first data line DL1. Also, the second active layer A12 comprises one channel by intersecting the second gate line GL2. The first data line DL1 acting as the second source electrode S12 comes into contact with one end of the second active layer A12 via a second source contact hole SH12. Since the first data line DL1 acts as the second source electrode S12, the second source contact hole SH12 overlaps the first data line DL1. The second drain electrode D12 comes into contact with the other end of the second active layer A12 via a second drain contact hole DH12. The second drain contact hole DH12 does not overlap the second gate line GL2 but is spaced apart from it. The second pixel electrode PX12 has the shape of a line segment, and is arranged parallel to the first data line DL1. The second pixel electrode PX12 is connected to the second drain electrode D12 of the second thin-film transistor T12 via a second via hole PH12. The second via hole PH12 overlaps the second drain contact hole DH12. The second pixel electrode PX12 and the common electrode Vcom face each other, forming an electric field.

In the meantime, in the first pixel portion P1 of present invention, the first pixel electrode PX11 is arranged parallel to the direction in which the first data line DL1 extends, and the first pixel electrode PX11 extends from the first drain electrode D11 in the opposite direction to the adjacent second pixel portion P2. Here, the direction in which the first pixel electrode PX11 extends refers to the direction in which the first pixel electrode PX11 extends from the first drain electrode D11. Accordingly, the first pixel electrode PX11 extends upward in the drawing. In contrast, in the second pixel portion P2, the second pixel electrode PX12 is arranged parallel to the direction in which the first data line DL1 extends, and the second pixel electrode PX12 extends from the second drain electrode D12 in the opposite direction to the adjacent first pixel portion P1. That is, the second pixel electrode PX12 extends downward in the drawing. Also, the first drain electrode D11 of the first pixel portion P1 and the second drain electrode D12 of the second pixel portion P2 are disposed between the first gate line GL1 and the second gate line GL2. Accordingly, the first pixel electrode Px11 of the first pixel portion P1 and the second pixel electrode PX12 of the second pixel portion P2 extend in different directions, i.e., in the opposite directions.

The third pixel portion P3 of present invention is defined by the intersection of the first gate line GL1 and the second data line DL2. The third pixel portion P3 comprises a third thin-film transistor T13 provided at the intersection between the first gate line GL1 and the second data line DL2, and a third pixel electrode PX13 connected to the third thin-film transistor T13. The third thin-film transistor T13 of the third pixel portion P3 comprises a third active layer A13, the first gate line GL1 acting as a gate electrode, the second data line DL2 acting as a third source electrode S13, and a third drain electrode D13. The third active layer A13 is in an I-shape as it overlaps the second data line DL2. Also, the third active layer A13 comprises one channel by intersecting the first gate line GL1. The second data line DL2 acting as the third source electrode S13 comes into contact with one end of the third active layer A13 via a third source contact hole SH13. Since the second data line DL2 acts as the third source electrode S13, the third source contact hole SH13 overlaps the second data line DL2. The third drain electrode D13 comes into contact with the other end of the third active layer A13 via a third drain contact hole DH13. The third drain contact hole DH13 does not overlap the first gate line GL1 but is spaced apart from it. The third pixel electrode PX13 has the shape of a line segment, and is arranged parallel to the second data line DL2. The third pixel electrode PX13 is connected to the third drain electrode D13 of the third thin-film transistor T13 via a third via hole PH13. The third via hole PH13 overlaps the third drain contact hole DH13 adjacent to the third drain contact hole DH13. The third pixel electrode PX13 and the common electrode Vcom face each other, forming an electric field.

The fourth pixel portion P4 of present invention is defined by the intersection of the second gate line GL2 and the second data line DL2. The fourth pixel portion P4 comprises a fourth thin-film transistor T14 provided at the intersection between the second gate line GL2 and the second data line DL2, and a fourth pixel electrode PX14 connected to the fourth thin-film transistor T14. The fourth thin-film transistor T14 of the fourth pixel portion P4 comprises a fourth active layer A14, the second gate line GL2 acting as a gate electrode, the second data line DL2 acting as a fourth source electrode S14, and a fourth drain electrode D14. The fourth active layer A14 is in an I-shape as it overlaps the second data line DL2. Also, the fourth active layer A14 comprises one channel by intersecting the second gate line GL2. The second data line DL2 acting as the fourth source electrode S14 comes into contact with one end of the fourth active layer A14 via a fourth source contact hole SH14. Since the second data line DL2 acts as the fourth source electrode S14, the fourth source contact hole SH14 overlaps the second data line DL2. The fourth drain electrode D14 comes into contact with the other end of the fourth active layer A14 via a fourth drain contact hole DH14. The fourth drain contact hole DH14 does not overlap the second gate line GL2 but is spaced apart from it. The fourth pixel electrode PX14 has the shape of a line segment, and is arranged parallel to the second data line DL2. The fourth pixel electrode PX14 is connected to the fourth drain electrode D14 of the fourth thin-film transistor T14 via a fourth via hole PH14. The fourth via hole PH14 overlaps the fourth drain contact hole DH14 adjacent to the fourth drain contact hole DH14. The fourth pixel electrode PX14 and the common electrode Vcom face each other, forming an electric field.

In the above-described third pixel portion P3 of present invention, the third pixel electrode PX13 is arranged parallel to the direction in which the second data line DL2 extends, and the third pixel electrode PX13 extends from the third drain electrode D13 in the direction of the adjacent fourth pixel portion P4. In other words, the third pixel electrode PX13 extends downward in the drawing. In contrast, in the fourth pixel portion P4, the fourth pixel electrode PX14 is arranged parallel to the direction in which the second data line DL2 extends, and the fourth pixel electrode PX14 extends from the fourth drain electrode D14 in the direction of the adjacent third pixel portion P3. That is, the fourth pixel electrode PX14 extends upward in the drawing. Also, the third drain electrode D13 of the third pixel portion P3 is disposed above the first gate line GL1, and the fourth drain electrode D14 of the fourth pixel portion P4 is disposed below the second gate line GL2. The third pixel electrode PX13 and the fourth pixel electrode PX14 are disposed between the first gate line GL1 and the second gate line GL2. Accordingly, the third pixel electrode PX13 of the third pixel portion P3 and the fourth pixel electrode PX14 of the fourth pixel portion P4 extend in different directions, i.e., in the opposite directions.

The structure of the first to fourth pixel portions P1, P2, P3, and P4 according to present invention will now be discussed. The first pixel electrode PX11 of the first pixel portion P1 and the third pixel electrode PX13 of the third pixel portion P3 extend in different directions, and the second pixel electrode PX12 of the second pixel portion P2 and the fourth pixel electrode PX14 of the fourth pixel portion P4 extend in different directions. Also, the second pixel electrode PX12 of the second pixel portion P2 and the third pixel electrode PX13 of the third pixel portion P3 extend in the same direction, and the first pixel electrode PX11 of the first pixel portion P1 and the fourth pixel electrode PX14 of the fourth pixel portion P4 extend in the same direction. Accordingly, the third pixel electrode PX13 of the third pixel portion P3 and the fourth pixel electrode PX14 of the fourth pixel portion P4 are positioned to face each other.

The first to fourth pixel portions P1, P2, P3, and P4 are arranged in a repeating pattern on the thin-film transistor array substrate of present invention. In other words, pairs of pixel portions facing each other are repeatedly arranged in the columns between each data line DL1, DL2, . . . , and adjacent pixel portions in the same row but in different columns are the reverse of each other.

For example, the column between the first and second data lines DL1 and DL2 in which the first and second pixel portions P1 and P2 are arranged is defined as a first column, and the column next to the second data line DL2 in which the third and fourth pixel portions P3 and P4 are arranged is defined as a second column, and the row in which the first and third pixel portions P1 and P3 are arranged is defined as a first row, and the row in which the second and fourth pixel portions P2 and P4 are arranged is defined as a second row. In this case, the third and fourth pixel portions P3 and P4 are arranged in the second column, and the first pixel portion P1 having the same shape as the fourth pixel portion P4 is positioned one row above the fourth pixel portion P4. Although not shown, a pixel portion having the same shape as the third pixel portion P3 is positioned above the first pixel portion P1, and this pixel portion has a pixel electrode facing the first pixel electrode PX11 of the first pixel portion P1.

Now, a cross-sectional structure of the display device according to the first exemplary embodiment of the present invention will be described with reference to FIG. 5, the aforementioned cross-sectional view taken along line I-I' of FIG. 4.

Referring to FIG. 5, a display device 100 according to this exemplary embodiment of the present invention uses a coplanar-type thin-film transistor whose gate electrode is positioned on top of an active layer.

More specifically, a light blocking layer LS is positioned on a substrate SUB. The substrate SUB is made of transparent or opaque glass, plastic, or metal. The light blocking layer LS is for blocking outside light from entering, and made of a material that can block light. The light blocking layer LS may be made of low-reflectivity materials; for example, resins such as carbon black that produce black colors or semiconductor materials such as amorphous silicon (a-Si), germanium (Ge), tantalum oxide (TaOx), and copper oxide (CuOx). A buffer layer 120 is positioned over the entire substrate SUB where the light blocking layer LS is positioned. The buffer layer 120 is formed to protect thin-film transistors, which are to be formed in a subsequent process, from impurities such as alkali ions released from the substrate SUB or the underlying layers, and is made of silicon oxide (SiOx), silicon nitride (SiNx), or multiple layers of these elements.

A first active layer A11 is positioned on the buffer layer 120. The first active layer A11 is made of an oxide semiconductor. The oxide semiconductor is an amorphous zinc oxide semiconductor, for example—especially, a-IGZO semiconductor is formed by a sputtering method using a composite target of gallium(III) oxide ($Ga_2O_3$), indium(III) oxide ($In_2O_3$), or zinc oxide (ZnO). Besides, chemical deposition technique such as chemical vapor deposition or atomic layer deposition (ALD) may be used. In this exemplary embodiment of the present invention, a zinc oxide semiconductor may be deposited using oxide targets whose gallium:indium:zinc atomic ratios are 1:1:1, 2:2:1, 3:2:1, and 4:2:1, respectively. However, the active layer of present invention is not limited to zinc oxide semiconductors.

The first active layer A11 comprises one channel CH. The channel CH corresponds to an area overlapping the first gate line GL1 acting as a gate electrode. The channel CH is formed by doping the first active layer A11 with an impurity. A gate insulating layer 125 is positioned on the first active layer A11. The gate insulating layer 125 is made of silicon oxide (SiOx), silicon nitride (SiNx), or multiple layers of these elements. The gate insulating layer 125 insulates the first gate line GL1 and the first active layer A11 from each other. The first gate line GL1 is positioned on the gate insulating layer 125. The first gate line GL1 is made of any one selected from the group consisting of copper (Cu), molybdenum (Mo), aluminum (Al), chrome (Cr), gold (Au), titanium (Ti), nickel (Ni), neodymium (Nd), tantalum (Ta), and tungsten (W) or a single layer or multiple layers of alloys of these elements. The first gate line GL1 is positioned to correspond to the channel CH of the first active layer A11.

An interlayer insulating layer 130 is positioned on the substrate SUB where the first gate line GL1 is formed. The interlayer insulating layer 130 is made of silicon oxide (SiOx), silicon nitride (SiNx), or multiple layers of these elements. Also, the interlayer insulating layer 130 comprises a first source contact hole SH11 and first drain contact hole DH11 that expose the source and drain regions on both sides of the first active layer A11. The first data line DL1 acting as a source electrode and the first drain electrode D11 are positioned on the interlayer insulating layer 130. The first data line DL1 and the first drain electrode D11 may consist of a single layer or multiple layers. If the first data line DL1 and the first drain electrode D11 consist of a single layer, they may be made of any one selected from the group consisting of copper (Cu), molybdenum (Mo), aluminum (Al), chrome (Cr), gold (Au), titanium (Ti), nickel (Ni), neodymium (Nd), tantalum (Ta), and tungsten (W) or an alloy of these elements. On the other hand, if the first data line DL1 and the first drain electrode D11 consist of multiple layers, they may be made of two layers of molybdenum/aluminum-neodymium, molybdenum/aluminum, or titanium/aluminum, or three layers of molybdenum/aluminum-neodymium/molybdenum, molybdenum/aluminum/molybdenum, or titanium/aluminum/titanium. The first data line DL1 and the first drain electrode D11 are connected to the source and drain regions of the first active layer A11, respectively, via the first source contact hole SH11 and first drain contact hole DH11 formed in the interlayer insulating layer 130.

A first passivation layer 140 protects the thin-film transistors, and is made of silicon oxide (SiOx), silicon nitride (SiNx), or multiple layers of these elements. An organic insulating layer 150 is positioned on the first passivation layer 140. The organic insulating layer 150 evens out irregularities in the underlying part, and may be made of organic materials such as photoacryl, polyimide, benzocyclobutene resin, and acrylate. A common electrode Vcom is positioned on the organic insulating layer 150. The common electrode Vcom is formed as a single unit over the entire surface of the substrate SUB, except for holes, is applied with a common voltage, and may be consist of a transparent conductive film. The transparent conductive film may be a transparent and conductive material such as ITO (indium tin oxide) or IZO (indium zinc oxide). A second passivation layer 170 is positioned on the common electrode Vcom. The second passivation layer 170 may be made of silicon oxide (SiOx), silicon nitride (SiNx), or multiple layers of these elements. A first pixel electrode PX11 is positioned on the second passivation layer 170. The first pixel electrode PX11 consists of a transparent conductive film, like the common electrode Vcom. Also, the first pixel electrode PX11 comes into contact with the first drain electrode D11 via a first via hole PH11. In this way, the display device according to the first exemplary embodiment of the present invention is made.

Alternatively, a display device of present invention may be configured such that two gate lines are formed in a single pixel portion. In the following description, the same components as the first exemplary embodiment of the present invention will be denoted by the same reference numerals for better comprehension.

Figure 6:
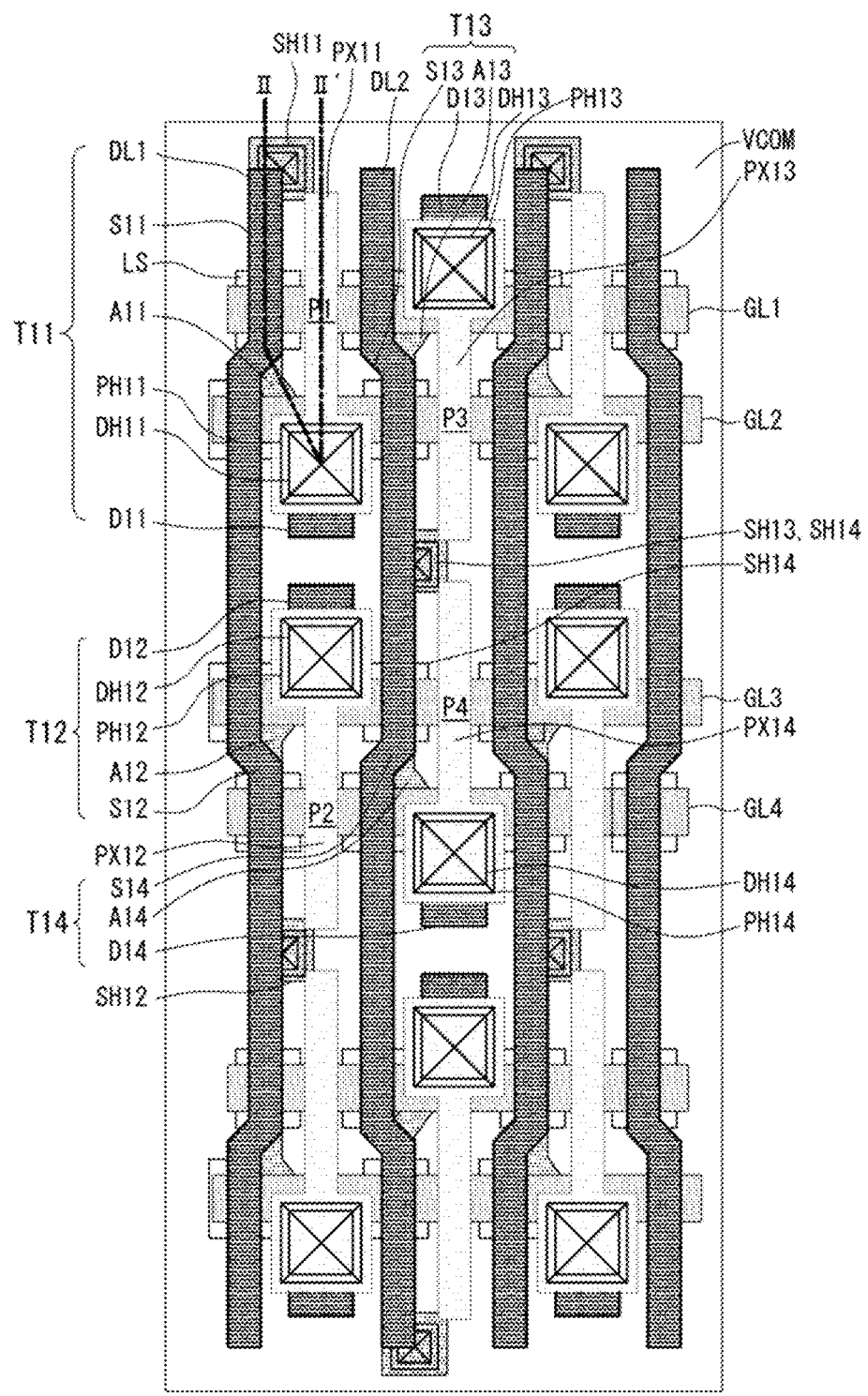
FIG. 6 is a plan view showing a thin-film transistor array substrate for a liquid crystal display according to a second exemplary embodiment of the present invention.
Figure 7:
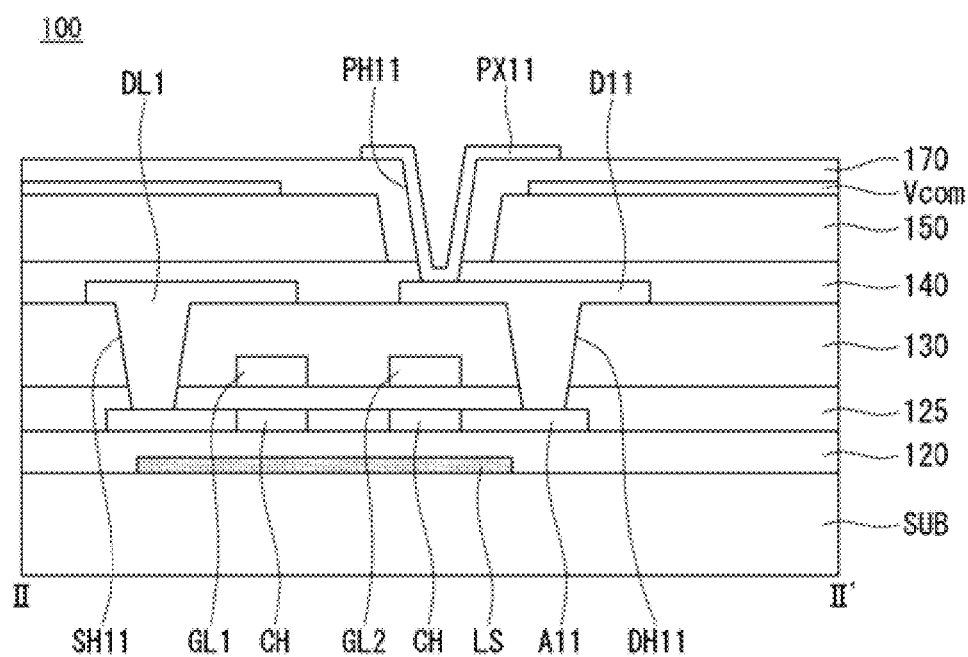
FIG. 7 is a cross-sectional view taken along line II-II' of FIG. 6.

FIG. 6 is a plan view showing a thin-film transistor array substrate for a liquid crystal display according to a second exemplary embodiment of the present invention. FIG. 7 is a cross-sectional view taken along line II-II' of FIG. 6.

Referring to FIG. 6, a thin-film transistor array substrate for a liquid crystal display according to the second exemplary embodiment of the present invention comprises a plurality of gate lines GL1, GL2, GL3, GL4, . . . extending horizontally on a substrate SUB and a plurality of data lines DL1, DL2, . . . extending vertically on the substrate SUB. A pixel area is defined a rectangular area defined by the intersection of the gate lines GL, GL2, GL3, GL4, . . . and the data lines DL1, DL2, . . . .

A pixel area at the top of the left side of a certain data line DL2 is defined as a first pixel portion P1, a pixel area below the first pixel portion P1 is defined as a second pixel portion P2, a pixel area at the top of the right side of the data line DL2 is defined as a third pixel portion P3, and a pixel area below the third pixel portion P3 is defined as a fourth pixel portion P4.

The first pixel portion P1 of present invention is defined as a point where the first and second gate lines GL1 and GL2 and the first data line DL1 intersect. The first pixel portion P1 comprises a first thin-film transistor T11 provided at the intersection between the first and second gate lines GL1 and GL2 and the first data line DL1, and a first pixel electrode PX11 connected to the first thin-film transistor T11. The first thin-film transistor T11 of the first pixel portion P1 comprises a first active layer A11, the first and second gate lines GL1 and GL2 acting as gate electrodes, a first source electrode S11, and a first drain electrode D11. The first active layer A11 is in an I-shape as it overlaps the first data line DL1. Also, the first active layer A11 comprises two channels by intersecting the first and second gate lines GL1 and GL2. The first data line DL1 acting as the first source electrode S11 extends to come into contact with one end of the first active layer A11 via a first source contact hole SH11. Since the first data line DL1 acts as a source electrode, the first source contact hole SH11 overlaps the first data line DL1. The first drain electrode D11 comes into contact with the other end of the first active layer A11 via a first drain contact hole DH11. The first drain contact hole DH11 does not overlap the first and second gate lines GL1 and GL2 but is spaced apart from them.

The first pixel electrode PX11 has the shape of a line segment, and is arranged parallel to the first data line DL1. The higher the resolution, the smaller the number of line segments of the first pixel electrode PX11. Although, in the present invention, the first pixel electrode PX11 consists of a single line segment, it may consist of, for example, three to four line segments (or fingers) at a resolution of about 300 PPI or two or three line segments at a resolution of 400 to 500 PPI. The first pixel electrode PX11 may consist of one or two line segments at an ultra-high resolution of 600 PPI or higher. The first pixel electrode PX11 intersects the first gate lines GL1 and the second gate line GL2.

The first pixel electrode PX11 is connected to the first drain electrode D11 of the first thin-film transistor T11 via a first via hole PH11. The first via hole PH11 overlaps the first drain contact hole DH11. The first pixel electrode PX11 and the common electrode Vcom face each other, forming an electric field. The common electrode Vcom may be configured to cover most of the area of the substrate SUB. In this case, the common electrode Vcom is in the form of a surface electrode that occupies most of the first pixel electrode PX11. As a result, the common electrode Vcom and the first pixel electrode PX11 overlap each other with a passivation layer between them, thereby forming a horizontal electric field caused by a fringe field.

Although this drawing illustrates a thin-film transistor with an I-shaped channel forming region, the present invention is not limited to this, but a thin-film transistor with a U-shaped channel forming region is also applicable. Moreover, although this drawing illustrates that the gate electrode of a thin-film transistor acts as a gate line, the present invention is not limited to this, but the gate electrode may be a projection from the gate line.

The second pixel portion P2 of present invention is defined by the intersection of the third and fourth gate lines GL3 and GL4 and the first data line DL1. The second pixel portion P2 comprises a second thin-film transistor T12 provided at the intersection between the third and fourth gate lines GL3 and GL4 and the first data line DL1, and a second pixel electrode PX12 connected to the second thin-film transistor T12. The second thin-film transistor T12 of the second pixel portion P2 comprises a second active layer A12, the third and fourth gate lines GL3 and GL4 acting as a gate electrode, the first data line DL1 acting as a second source electrode S12, and a second drain electrode D12. The second active layer A12 is in an I-shape as it overlaps the first data line DL1. Also, the second active layer A12 comprises two channels by intersecting the third and fourth gate lines GL3 and GL4. The first data line DL1 acting as the second source electrode S12 comes into contact with one end of the second active layer A12 via a second source contact hole SH12. Since the first data line DL1 acts as the second source electrode S12, the second source contact hole SH12 overlaps the first data line DL1. The second drain electrode D12 comes into contact with the other end of the second active layer A12 via a second drain contact hole DH12. The second drain contact hole DH12 does not overlap the third and fourth gate lines GL3 and GL4 but is spaced apart from it. The second pixel electrode PX12 has the shape of a line segment, and is arranged parallel to the first data line DL1. The second pixel electrode PX12 is connected to the second drain electrode D12 of the second thin-film transistor T12 via a second via hole PH12. The second via hole PH12 overlaps the second drain contact hole DH12. The second pixel electrode PX12 and the common electrode Vcom face each other, forming an electric field.

In the meantime, in the first pixel portion P1 of present invention, the first pixel electrode PX11 is arranged parallel to the direction in which the first data line DL1 extends, and the first pixel electrode PX11 extends from the first drain electrode D11 in the opposite direction to the adjacent second pixel portion P2. Here, the direction in which the first pixel electrode PX11 extends refers to the direction in which the first pixel electrode PX11 extends from the first drain electrode D11. Accordingly, the first pixel electrode PX11 extends upward in the drawing. In contrast, in the second pixel portion P2, the second pixel electrode PX12 is arranged parallel to the direction in which the first data line DL1 extends, and the second pixel electrode PX12 extends from the second drain electrode D12 in the opposite direction to the adjacent first pixel portion P1. That is, the second pixel electrode PX12 extends downward in the drawing. Also, the first drain electrode D11 of the first pixel portion P1 and the second drain electrode D12 of the second pixel portion P2 are disposed between the second gate line GL2 and the third gate line GL3. Accordingly, the first pixel electrode Px11 of the first pixel portion P1 and the second pixel electrode PX12 of the second pixel portion P2 extend in different directions, i.e., in the opposite directions.

The third pixel portion P3 of present invention is defined by the intersection of the first and second gate lines GL1 and GL2 and the second data line DL2. The third pixel portion P3 comprises a third thin-film transistor T13 provided at the intersection between the first and second gate lines GL1 and GL2 and the second data line DL2, and a third pixel electrode PX13 connected to the third thin-film transistor T13. The third thin-film transistor T13 of the third pixel portion P3 comprises a third active layer A13, the first and second gate lines GL1 and GL2 acting as gate electrodes, the second data line DL2 acting as a third source electrode S13, and a third drain electrode D13. The third active layer A13 is in an I-shape as it overlaps the second data line DL2. Also, the third active layer A13 comprises two channels by intersecting the first and second gate lines GL1 and GL2. The second data line DL2 acting as the third source electrode S13 comes into contact with one end of the third active layer A13 via a third source contact hole SH13. Since the second data line DL2 acts as the third source electrode S13, the third source contact hole SH13 overlaps the second data line DL2. The third drain electrode D13 comes into contact with the other end of the third active layer A13 via a third drain contact hole DH13. The third drain contact hole DH13 does not overlap the first and second gate lines GL1 and GL2 but is spaced apart from it. The third pixel electrode PX13 has the shape of a line segment, and is arranged parallel to the second data line DL2. The third pixel electrode PX13 is connected to the third drain electrode D13 of the third thin-film transistor T13 via a third via hole PH13. The third via hole PH13 overlaps the third drain contact hole DH13 adjacent to the third drain contact hole DH13. The third pixel electrode PX13 and the common electrode Vcom face each other, forming an electric field.

The fourth pixel portion P4 of present invention is defined by the intersection of the third and fourth gate lines GL3 and GL4 and the second data line DL2. The fourth pixel portion P4 comprises a fourth thin-film transistor T14 provided at the intersection between the third and fourth gate lines GL3 and GL4 and the second data line DL2, and a fourth pixel electrode PX14 connected to the fourth thin-film transistor T14. The fourth thin-film transistor T14 of the fourth pixel portion P4 comprises a fourth active layer A14, the third and fourth gate lines GL2 acting as gate electrodes, the second data line DL2 acting as a fourth source electrode S14, and a fourth drain electrode D14. The fourth active layer A14 is in an I-shape as it overlaps the second data line DL2. Also, the fourth active layer A14 comprises two channels by intersecting the third and fourth gate lines GL3 and GL4. The second data line DL2 acting as the fourth source electrode S14 comes into contact with one end of the fourth active layer A14 via a fourth source contact hole SH14. Since the second data line DL2 acts as the fourth source electrode S14, the fourth source contact hole SH14 overlaps the second data line DL2. The fourth drain electrode D14 comes into contact with the other end of the fourth active layer A14 via a fourth drain contact hole DH14. The fourth drain contact hole DH14 does not overlap the third and fourth gate lines GL3 and GL4 but is spaced apart from it. The fourth pixel electrode PX14 has the shape of a line segment, and is arranged parallel to the second data line DL2. The fourth pixel electrode PX14 is connected to the fourth drain electrode D14 of the fourth thin-film transistor T14 via a fourth via hole PH14. The fourth via hole PH14 overlaps the fourth drain contact hole DH14 adjacent to the fourth drain contact hole DH14. The fourth pixel electrode PX14 and the common electrode Vcom face each other, forming an electric field.

In the above-described third pixel portion P3 of present invention, the third pixel electrode PX13 is arranged parallel to the direction in which the second data line DL2 extends, and the third pixel electrode PX13 extends from the third drain electrode D13 in the direction of the adjacent fourth pixel portion P4. In other words, the third pixel electrode PX13 extends downward in the drawing. In contrast, in the fourth pixel portion P4, the fourth pixel electrode PX14 is arranged parallel to the direction in which the second data line DL2 extends, and the fourth pixel electrode PX14 extends from the fourth drain electrode D14 in the direction of the adjacent third pixel portion P3. That is, the fourth pixel electrode PX14 extends upward in the drawing. Also, the third drain electrode D13 of the third pixel portion P3 is disposed above the first gate line GL1, and the fourth drain electrode D14 of the fourth pixel portion P4 is disposed below the fourth gate line GL4. The third pixel electrode PX13 and the fourth pixel electrode PX14 are disposed between the second gate line GL2 and the third gate line GL3. Accordingly, the third pixel electrode PX13 of the third pixel portion P3 and the fourth pixel electrode PX14 of the fourth pixel portion P4 extend in different directions, i.e., in the opposite directions.

The structure of the first to fourth pixel portions P1, P2, P3, and P4 according to present invention will now be discussed. The first pixel electrode PX11 of the first pixel portion P1 and the third pixel electrode PX13 of the third pixel portion P3 extend in different directions, and the second pixel electrode PX12 of the second pixel portion P2 and the fourth pixel electrode PX14 of the fourth pixel portion P4 extend in different directions. Also, the second pixel electrode PX12 of the second pixel portion P2 and the third pixel electrode PX13 of the third pixel portion P3 extend in the same direction, and the first pixel electrode PX11 of the first pixel portion P1 and the fourth pixel electrode PX14 of the fourth pixel portion P4 extend in the same direction. Accordingly, the third pixel electrode PX13 of the third pixel portion P3 and the fourth pixel electrode PX14 of the fourth pixel portion P4 are positioned to face each other.

The first to fourth pixel portions P1, P2, P3, and P4 are arranged in a repeating pattern on the thin-film transistor array substrate of present invention. In other words, pairs of pixel portions facing each other are repeatedly arranged in the columns between each data line DL1, DL2, . . . , and adjacent pixel portions in the same rows but in different columns are the reverse of each other.

For example, the column between the first and second data lines DL1 and DL2 in which the first and second pixel portions P1 and P2 are arranged is defined as a first column, and the column next to the second data line DL2 in which the third and fourth pixel portions P3 and P4 are arranged is defined as a second column, and the row in which the first and third pixel portions P1 and P3 are arranged is defined as a first row, and the row in which the second and fourth pixel portions P2 and P4 are arranged is defined as a second row. In this case, the third and fourth pixel portions P3 and P4 are arranged in the second column, and the first pixel portion P1 having the same shape as the fourth pixel portion P4 is positioned one row above the fourth pixel portion P4. Although not shown, a pixel portion having the same shape as the third pixel portion P3 is positioned above the first pixel portion P1, and this pixel portion has a pixel electrode facing the first pixel electrode PX11 of the first pixel portion P1.

Now, a cross-sectional structure of the display device according to the second exemplary embodiment of the present invention will be described with reference to FIG. 7, the aforementioned cross-sectional view taken along line II-II' of FIG. 6.

Referring to FIG. 7, a display device 100 according to this exemplary embodiment of the present invention uses a coplanar-type thin-film transistor whose gate electrode is positioned on top of an active layer.

More specifically, a light blocking layer LS is positioned on a substrate SUB. The substrate SUB is made of transparent or opaque glass, plastic, or metal. The light blocking layer LS is for blocking outside light from entering, and made of a material that can block light. The light blocking layer LS may be made of low-reflectivity materials; for example, resins such as carbon black that produce black colors or semiconductor materials such as amorphous silicon (a-Si), germanium (Ge), tantalum oxide (TaOx), and copper oxide (CuOx). A buffer layer 120 is positioned over the entire substrate SUB where the light blocking layer LS is positioned. The buffer layer 120 is formed to protect thin-film transistors, which are to be formed in a subsequent process, from impurities such as alkali ions released from the substrate SUB or the overlying layers, and is made of silicon oxide (SiOx), silicon nitride (SiNx), or multiple layers of these elements.

A first active layer A11 is positioned on the buffer layer 120. The first active layer A11 is made of an oxide semiconductor. The oxide semiconductor is an amorphous zinc oxide semiconductor, for example—especially, a-IGZO semiconductor is formed by a sputtering method using a composite target of gallium(III) oxide ($Ga_2O_3$), indium(III) oxide ($In_2O_3$), or zinc oxide (ZnO). Besides, chemical deposition technique such as chemical vapor deposition or atomic layer deposition (ALD) may be used. In this exemplary embodiment of the present invention, a zinc oxide semiconductor may be deposited using oxide targets whose gallium:indium:zinc atomic ratios are 1:1:1, 2:2:1, 3:2:1, and 4:2:1, respectively. However, the active layer of present invention is not limited to zinc oxide semiconductors.

The first active layer A11 comprises two channels CH. The channels CH correspond to an area overlapping the first and second gate lines GL1 and GL2 acting as gate electrodes. A gate insulating layer 125 is positioned on the first active layer A11. The gate insulating layer 125 is made of silicon oxide (SiOx), silicon nitride (SiNx), or multiple layers of these elements. The gate insulating layer 125 insulates the first and second gate lines GL1 and GL2 and the first active layer A11 from each other. The first and second gate lines GL1 and GL2 are positioned on the gate insulating layer 125. The first and second gate lines GL1 and GL2 are made of any one selected from the group consisting of copper (Cu), molybdenum (Mo), aluminum (Al), chrome (Cr), gold (Au), titanium (Ti), nickel (Ni), neodymium (Nd), tantalum (Ta), and tungsten (W) or a single layer or multiple layers of alloys of these elements. The first and second gate lines GL1 and GL2 are positioned to correspond to the channels CH of the first active layer A11.

An interlayer insulating layer 130 is positioned on the substrate SUB where the first and second gate lines GL1 and GL2 are formed. The interlayer insulating layer 130 is made of silicon oxide (SiOx), silicon nitride (SiNx), or multiple layers of these elements. Also, the interlayer insulating layer 130 comprises a first source contact hole SH11 and first drain contact hole DH11 that expose the source and drain regions on both sides of the first active layer A11. The first data line DL1 acting as a source electrode and the first drain electrode D11 are positioned on the interlayer insulating layer 130. The first data line DL1 and the first drain electrode D11 may consist of a single layer or multiple layers. If the first data line DL1 and the first drain electrode D11 consist of a single layer, they may be made of any one selected from the group consisting of copper (Cu), molybdenum (Mo), aluminum (Al), chrome (Cr), gold (Au), titanium (Ti), nickel (Ni), neodymium (Nd), tantalum (Ta), and tungsten (W) or an alloy of these elements. On the other hand, if the first data line DL1 and the first drain electrode D11 consist of multiple layers, they may be made of two layers of molybdenum/aluminum-neodymium, molybdenum/aluminum, or titanium/aluminum, or three layers of molybdenum/aluminum-neodymium/molybdenum, molybdenum/aluminum/molybdenum, or titanium/aluminum/titanium. The first data line DL1 and the first drain electrode D11 are connected to the source and drain regions of the first active layer A11, respectively, via the first source contact hole SH11 and first drain contact hole DH11 formed in the interlayer insulating layer 130.

A first passivation layer 140 protects the thin-film transistors, and is made of silicon oxide (SiOx), silicon nitride (SiNx), or multiple layers of these elements. An organic insulating layer 150 is positioned on the first passivation layer 140. The organic insulating layer 150 evens out irregularities in the underlying part, and may be made of organic materials such as photoacryl, polyimide, benzocyclobutene resin, and acrylate. A common electrode Vcom is positioned on the organic insulating layer 150. The common electrode Vcom is formed as a single unit over the entire surface of the substrate SUB, except for holes, is applied with a common voltage, and may be consist of a transparent conductive film. The transparent conductive film may be a transparent and conductive material such as ITO (indium tin oxide) or IZO (indium zinc oxide). A second passivation layer 170 is positioned on the common electrode Vcom. The second passivation layer 170 may be made of silicon oxide (SiOx), silicon nitride (SiNx), or multiple layers of these elements. A first pixel electrode PX11 is positioned on the second passivation layer 170. The first pixel electrode PX11 consists of a transparent conductive film, like the common electrode Vcom. Also, the first pixel electrode PX11 comes into contact with the first drain electrode D11 via a first via hole PH11. In this way, the display device according to the second exemplary embodiment of the present invention is made.

In the arrangement of color filters in the above-described liquid crystal display shown in FIG. 1, one color filter may be allocated for each pixel portion. By having a pixel structure for ultra-high resolutions of 500 PPI or higher, high-resolution liquid crystal displays can reduce the area occupied by opening regions that let light pass through, resulting in a reduction in the size of the pixel portions. Better still, this should lead to a reduction in the size of color filters, which is the size of pixel portions. However, limitations on the size of a color filter pattern in the process of patterning color filters make it difficult to cope with the pixel portion size.

Accordingly, in the present invention, the structure of the pixel portions on the thin-film transistor array substrate was designed to be adapted to ultra-high resolution liquid crystal displays, as illustrated in the above FIGS. 4 to 7. Also, the structure of color filters was designed to correspond to the structure of the pixel portions on the thin-film transistor array substrate, as illustrated in FIGS. 8 to 11 below.

Figure 8:
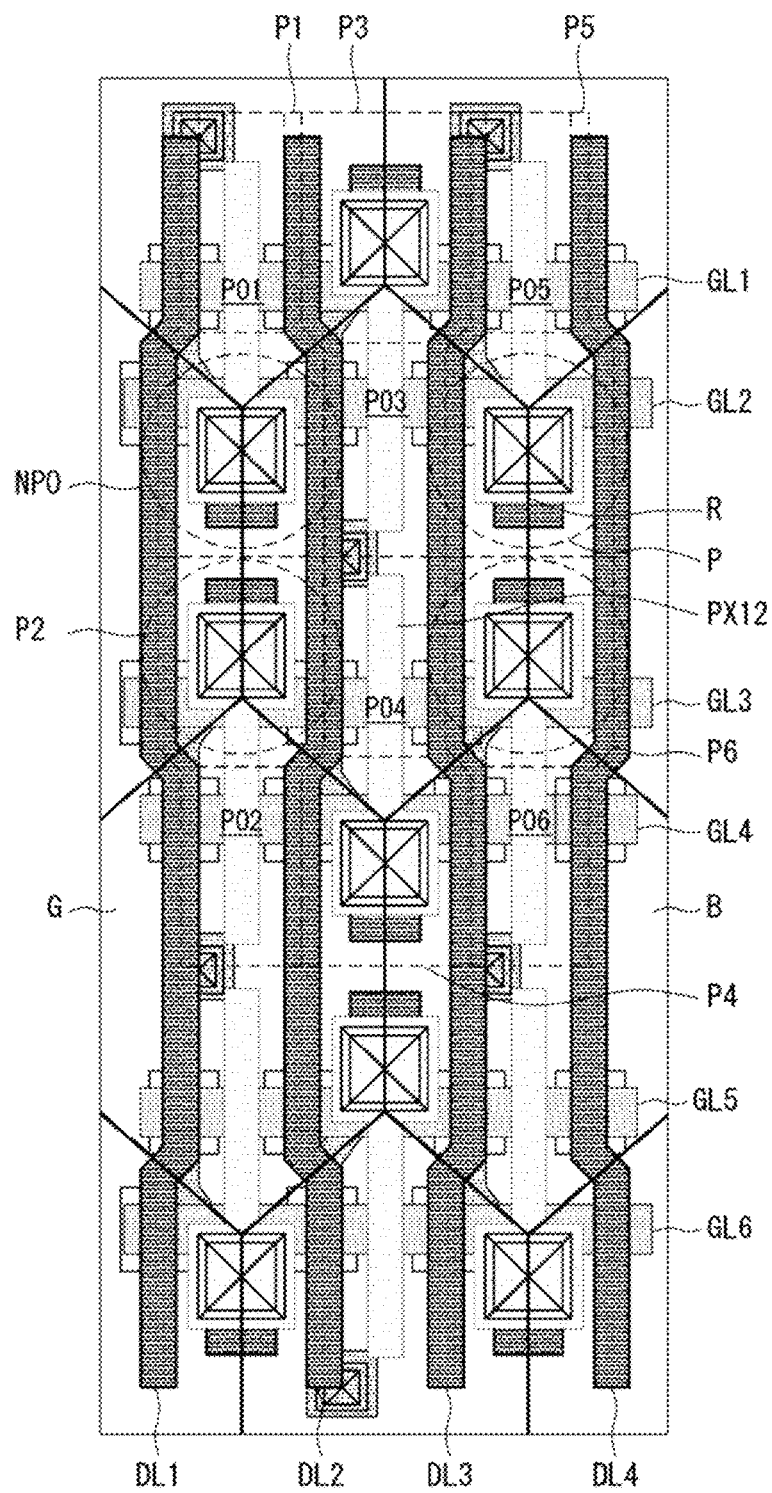
FIGS. 8 and 9 are plan views showing an example of the arrangement of color filters allocated for pixel portions according to a third exemplary embodiment of the present invention.
Figure 9:
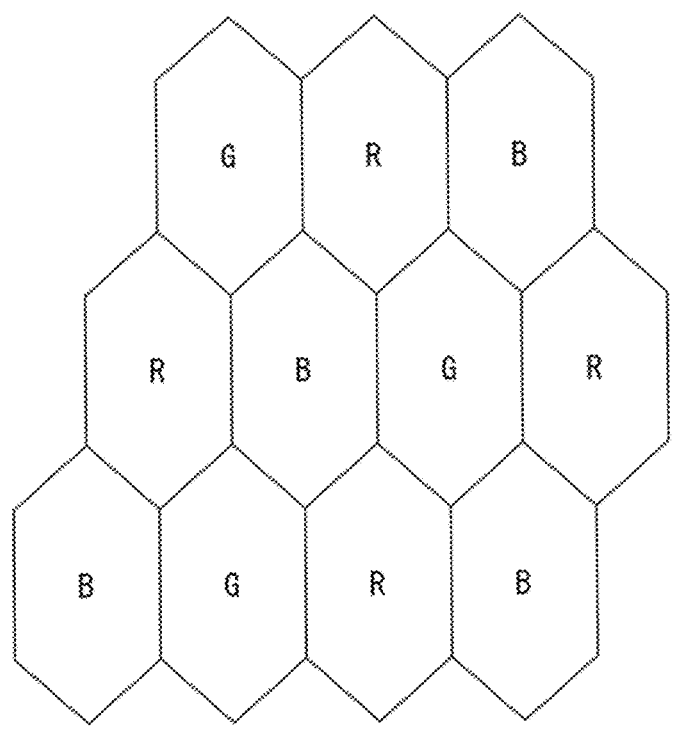
Figure 10:
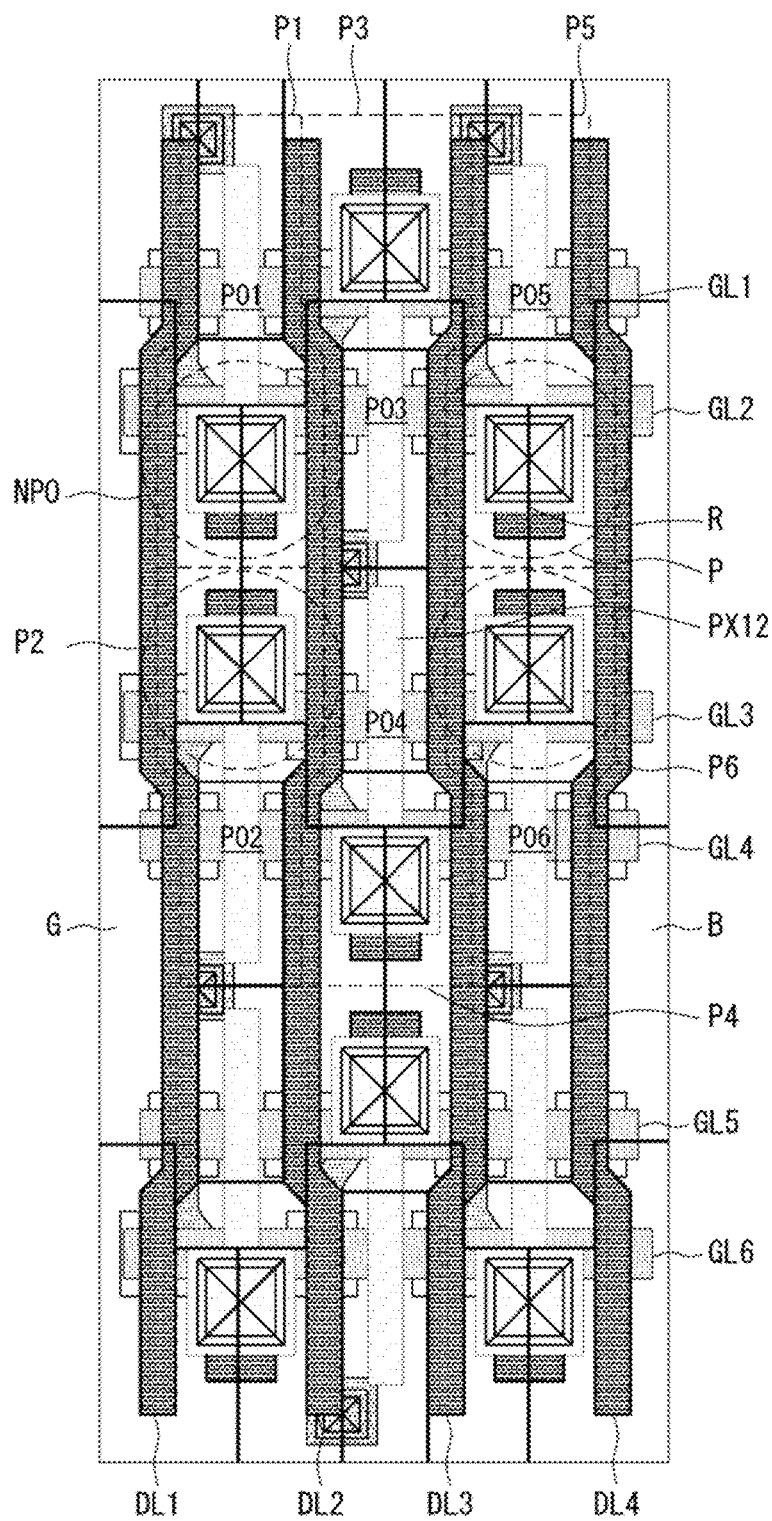
FIGS. 10 and 11 are plan views showing an example of the arrangement of color filters allocated for pixel portions according to a fourth exemplary embodiment of the present invention.
Figure 11:
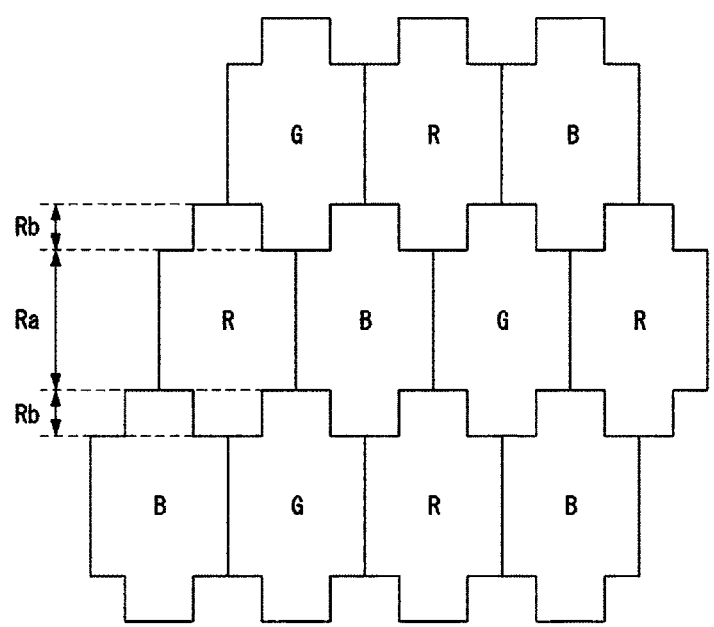

FIGS. 8 and 9 are plan views showing an example of the arrangement of color filters allocated for pixel portions according to a third exemplary embodiment of the present invention. FIGS. 10 and 11 are plan views showing an example of the arrangement of color filters allocated for pixel portions according to a fourth exemplary embodiment of the present invention.

Referring to FIGS. 8 and 9, three color filters, that is, red, green, and blue color filters R, G, and B may be arranged. First to fourth data lines DL1, DL2, DL3, and DL4 arranged between pixel portions P to define each of the pixel portions P act as a matrix. The first to fourth data lines DL1, DL2, DL3, and DL4 may be made of a metal material with low resistivity and high light absorptivity. Accordingly, there are no components acting as a black matrix between two pixel portions adjacent in the column direction. The absence of a black matrix may cause color mixing between adjacent pixel portions.

In the present invention, however, pixel portions facing each other may have color filters of the same color to prevent color mixing. The following description will be given of the red color filter R by way of example.

More specifically, the red color filter R is arranged to correspond to third and fourth pixel opening regions P03 and P04 of the third and fourth pixel portions P3 and P4. A single color filter R has a single pattern that represents the same color. A single color filter R is arranged to overlap both the third and fourth pixel opening regions P03 and P04 of the third and fourth pixel portions P3 and P4. As such, the third pixel portion P3 and the fourth pixel portion P4 both can let red light pass through, which means that two pixel portions are configured to pass light of a single color through.

Additionally, the red color filter R overlaps non-opening regions NPO of the first and fifth pixel portions P1 and P5 adjacent to the third pixel opening region P03 of the third pixel portion P3, and at the same time, overlaps non-opening regions NPO of the second and sixth pixel portions P2 and P6 adjacent to the fourth pixel opening region P04 of the fourth pixel portion P4. In short, a single red color filter R is arranged to overlap a total of six pixel portions. Also, the red color filter R is in the shape of a hexagon; likewise, green and blue color filters G and B adjacent to it are in the shape of a hexagon. Accordingly, the color filters are arranged in a honeycomb structure.

In the present invention, one color filter is configured to overlap the opening regions of two pixel portions and at the same time to overlap the non-opening regions of four pixel portions adjacent to the two pixel portions, so that the color filters are wide enough to enable the patterning process of the color filters. Patterning the color filters to a size smaller than 10 μm may cause problems such as tearing, because of the patterning process characteristics, which results in a reliability issue. Accordingly, in the present invention, the pixel electrodes of two pixel portions are arranged to face each other, a single color filter is configured to overlap opening regions of the two pixel portions and non-opening regions of four pixel portions adjacent to the two pixel portions. In this way, the color filters may be made wide enough to eliminate defects in the manufacturing process of color filters.

Although the above FIGS. 8 and 9 illustrate three color filters, i.e., red, green, and blue color filters, by way of example, four color filters including a white color filter may be provided.

Now, the liquid crystal display according to the fourth exemplary embodiment will be described below with reference to FIGS. 10 and 11. A red color filter R is arranged to correspond to third and fourth pixel opening regions P03 and P04 of the third and fourth pixel portions P3 and P4. A single color filter R is arranged to overlap both the third and fourth pixel opening regions P03 and P04 of the third and fourth pixel portions P3 and P4. As such, the third pixel portion P3 and the fourth pixel portion P4 both can let red light pass through, which means that two pixel portions are configured to pass light of a single color through. Additionally, the red color filter R overlaps non-opening regions NPO of four pixel portions adjacent to the third and fourth pixel openings P03 and P04 of the third and fourth pixel portions P3 and P4. In short, a single red color filter R is arranged to overlap a total of six pixel portions.

Unlike the above-described third exemplary embodiment, the red color filter R comprises a large quadrangular middle portion Ra and quadrangular projections Rb projecting upward and downward from the middle portion Ra. The middle portion Ra of the red color filter R is a portion for widening the color filter and preventing defects such as tearing in the patterning process of color filters. The projections Rb of the red color filter R serve to cover the opening regions of the pixel portions overlapping the red color filter R. The green and blue color filters G and B have the same shape as the red color filter R.

As for the above-described structure of color filters according to the fourth exemplary embodiment of the present invention, a single color filter is configured to overlap the opening regions of two pixel portions and the non-opening regions of four pixel portions adjacent to the two pixel portions. Accordingly, the color filters are made wide enough to facilitate the pattern process of color filters. Patterning the color filters to a size smaller than 10 μm may cause problems such as tearing, because of the patterning process characteristics, which results in a reliability issue. Accordingly, in the present invention, the pixel electrodes of two pixel portions are arranged to face each other, a single color filter is configured to overlap opening regions of the two pixel portions and non-opening regions of four pixel portions adjacent to the two pixel portions. In this way, the color filters may be made wide enough to eliminate defects in the manufacturing process of color filters. This offers the advantage of providing a display device with color filters that can cover pixel portions, which are getting smaller as the resolution increases, and therefore can cope with high-resolution models.

While the above-described third and fourth exemplary embodiments of the present invention have been described with respect to two types of color filter structures by way of example, the present invention is not limited to them and any color filter structure may be available as long as color filters are wide enough and can cover the opening portions of two pixel portions.

Moreover, the first, second, third, and fourth pixel portions in the foregoing exemplary embodiments of the present invention are numbered this way for better comprehension, but the present invention is not limited to this, and the third pixel portion may be construed as the first pixel portion and the fourth pixel portion may be construed as the second pixel portion. Additionally, the first, second, third, and fourth gate lines in the present invention are numbered this way for better comprehension, and the second gate line may be construed as the third gate line or other gate lines.

Although embodiments have been described with reference to a number of illustrative embodiments thereof, it should be understood that numerous other modifications and embodiments can be devised by those skilled in the art that will fall within the spirit and scope of the principles of this disclosure. More particularly, numerous variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a first pixel portion comprising a first thin-film transistor provided at an intersection between a first gate line and a first data line, and a first pixel electrode connected to the first thin-film transistor; and
   a second pixel portion comprising a second thin-film transistor provided at an intersection between a second gate line and the first data line, and a second pixel electrode connected to the second thin-film transistor,
   wherein the first pixel portion and the second pixel portion are arranged parallel to the first data line, and
   wherein a first major axis of the first pixel electrode extends from a first drain electrode of the first thin-film transistor toward the second pixel electrode, a second major axis of the second pixel extends from a second drain electrode of the second thin-film transistor toward the first pixel electrode, and ends of the first and second pixel electrodes face each other,
   wherein the first pixel electrode and the second pixel electrode have reflection symmetry about an imaginary line between the first pixel and the second pixel,
   wherein the imaginary line is perpendicular to the first major axis of the first pixel and the second major axis to the second pixel,
   wherein a width of the first drain is greater than a width of the first pixel electrode.

2. The display device of claim 1, further comprising:
   a third gate line parallel to the first gate line and intersecting the first pixel portion; and
   a fourth gate line parallel to the third gate line and intersecting the second pixel portion.

3. The display device of claim 1, wherein the first pixel electrode intersects the first gate line.

4. The display device of claim 3, wherein the first thin-film transistor includes a first active layer and the second thin-film transistor includes a second active layer.

5. The display device of claim 4, wherein the first active layer of the first thin-film transistor intersects the first gate line and a third gate line, and the second active layer of the second thin-film transistor intersects the second gate lines and a fourth gate line.

6. The display device of claim 1, further comprising a color filter that overlaps at least the first and second pixel portions.

7. The display device of claim 6, wherein the color filter emits one color and the first and second pixel portions share the color filter to emit the one color.

8. The display device of claim 7, wherein other color filters adjacent to the color filter have a same pattern as the color filter.

9. The display device of claim 6, wherein the color filter overlaps an opening region of the first pixel portion and an opening region of the second pixel portion.

10. The display device of claim 9, wherein the color filter overlaps non-opening regions of pixel portions adjacent to the opening region of the first pixel portion and non-opening regions of pixel portions adjacent to the opening region of the second pixel portion.

11. The display device of claim 6, wherein other color filters adjacent to the color filter and the color filter each have a hexagonal shape, and the color filter and the other color filters have a honeycomb arrangement.

12. The display device of claim 6, wherein the color filter comprises a middle portion and projections projecting upward and downward from the middle portion.

13. The display device of claim 12, wherein each of the middle portion and the projections are quadrangle-shaped.

14. The display device of claim 2, wherein the first gate line and the third gate line respectively activate two channels within the first thin-film transistor, and
   wherein the second gate line and the fourth gate line respectively activate two channels within the second thin-film transistor.

15. The display device of claim 1, wherein adjacent pixel portions adjacent to the first pixel portion and in a same row as the first pixel portion respectively include a corresponding pixel electrode with a major axis that extends in a direction opposite to the first pixel electrode.

16. A display device comprising:
   a first row of sub-pixels including corresponding first pixel electrodes disposed in a first alternating arrangement and corresponding first thin-film transistors;
   a second row of sub-pixels including corresponding second pixel electrodes disposed in a second alternating arrangement and corresponding second thin-film transistors; and
   a third row of sub-pixels including corresponding third pixel electrodes disposed in a third alternating arrangement and corresponding third thin-film transistors,
   wherein the second pixel electrodes include a upward facing set of pixel electrodes and a downward facing set of pixel electrodes,
   wherein a major axis of each pixel electrode in the upward facing set of pixel electrodes extends from one of the corresponding second thin-film transistors toward one of the corresponding first pixel electrodes in the first row of sub-pixels, and
   wherein a major axis of each pixel electrode in the downward facing set of pixel electrodes extends from one of the corresponding second thin-film transistors toward one of the corresponding third pixel electrodes in the third row of sub-pixels,
   wherein a pixel electrode in the first row or the third row and a pixel electrode in the second row have reflection symmetry about a first imaginary line between the pixel electrode in the first row or the third row and the pixel electrode in the second row, and
   wherein the imaginary line is perpendicular to a major axis of the pixel electrode in the first row or the third row and is perpendicular to a major axis of the pixel electrode in the second row, and
   wherein a width of a drain of one of the first, second or third thin-film transistors is greater than a width of the corresponding the pixel electrode.

17. The display device of claim 16, wherein the upward facing set of pixel electrodes in the second row of sub-pixels each share a color filter with one of the corresponding first pixel electrodes in the first row and form a first set of sub-pixel pairs, and wherein the downward facing set of pixel electrodes in the second row of sub-pixels each share a color filter with one of the corresponding third pixel electrodes in the third row and form a second set of sub-pixel pairs.

18. The display device of claim 17, wherein each of the first set of sub-pixel pairs and each of the second set of sub-pixel pairs has a hexagonal shape.

19. The display device of claim 17, wherein each of the first set of sub-pixel pairs and each of the second set of sub-pixel pairs includes a middle portion and projections projecting from opposite sides of the middle portion.

* * * * *